(12) United States Patent
Song et al.

(10) Patent No.: US 6,756,856 B2
(45) Date of Patent: Jun. 29, 2004

(54) CLOCK GENERATION CIRCUITS AND INTEGRATED CIRCUIT MEMORY DEVICES FOR CONTROLLING A CLOCK PERIOD BASED ON TEMPERATURE AND METHODS FOR USING THE SAME

(75) Inventors: Ki-hwan Song, Seoul (KR); Ho-Sung Song, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 10/051,916

(22) Filed: Jan. 17, 2002

(65) Prior Publication Data

US 2002/0180543 A1 Dec. 5, 2002

(30) Foreign Application Priority Data

May 31, 2001 (KR) .......................................... 2001-30522

(51) Int. Cl.$^7$ ................................................. H03L 1/00
(52) U.S. Cl. ......................... 331/176; 331/66; 365/211; 365/222
(58) Field of Search ................... 331/66, 176; 365/211, 365/222

(56) References Cited

U.S. PATENT DOCUMENTS

| 5,278,796 | A | * | 1/1994 | Tillinghast et al. | .......... 365/222 |
| 6,453,218 | B1 | * | 9/2002 | Vergis | ........................ 365/222 |
| 6,483,764 | B2 | * | 11/2002 | Chen Hsu et al. | .......... 365/222 |

FOREIGN PATENT DOCUMENTS

EP         325026       *  7/1989

OTHER PUBLICATIONS

Millman "Micro–Electronics Digital and Analog Circuits and Systems" McGraw–Hill Book Company 1979, pp 276–286 Kagenishi et al. "Low Power Self Refresh Mode DRAM with Temperature detecting circuit" Symposium on ULSI Circuits 1993 Digest of Technical Papers pp 43–44.*

* cited by examiner

Primary Examiner—Michael B Shingleton
(74) Attorney, Agent, or Firm—Myers Bigel Sibley & Sajovec

(57) ABSTRACT

Clock generation circuits for an integrated circuit device are provided including a temperature sensor circuit, the temperatures sensor circuit including a calibration circuit responsive to a temperature coding signal and a temperature sensor. The temperature sensor circuit has a first or test mode state in which a temperature output signal of the temperature sensor circuit is based on a temperature sensor output control signal and a second or normal operating mode state in which the temperature output signal is based on the temperature sensor and the calibration circuit. A clock period controller circuit includes a calibration circuit responsive to a period coding signal. The clock period controller circuit generates a period control signal based on the temperature output signal and the calibration circuit of the clock period controller circuit. A clock generator circuit generates a clock signal based on the period control signal. Integrated circuit memory devices and methods for controlling the refresh period of the memory devices are also provided.

27 Claims, 2 Drawing Sheets

CLOCK GENERATION CIRCUITS AND INTEGRATED CIRCUIT MEMORY DEVICES FOR CONTROLLING A CLOCK PERIOD BASED ON TEMPERATURE AND METHODS FOR USING THE SAME

RELATED APPLICATION

This application claims priority from Korean Application No. 2001-30522, filed May 31, 2001, the disclosure of which is hereby incorporated herein by reference.

BACKGROUND OF THE INVENTION

The present invention relates to integrated circuit devices and, more particularly, to integrated circuit devices having clocks with a selectable period and methods for using the same.

It is well known to store data in integrated circuit memory devices, including memory devices that store the data as an electric charge in a capacitor. Such memory devices typically refresh the stored data as the electrical charge may otherwise be lost, for example, due to leakage currents from a capacitor. One known approach is called a refresh operation in which the stored data is completely erased and the data is repeatedly retrieved and rewritten. An example of such a device is a dynamic random access memory (DRAM). DRAMs of this type generally cannot be accessed during the refresh operation. The time during which a DRAM cannot be accessed during the refresh operation is generally called a busy rate. It is preferable to have the busy rate as short as possible.

It is also known to provide computer systems or other devices including such DRAM with a sleep mode in which much of the electronic circuitry of the computer system is turned off to reduce power consumption. However, DRAMs of the type described above are generally not turned off because they typically need to be continuously refreshed to maintain data. Therefore, a self-refresh current generally is allowed to flow through the DRAMs even during the sleep mode of the computer system. As a result, it is desirable to reduce the self-refresh current, especially where the computer system is battery operated.

Various approaches have been suggested to reduce the self-refresh current flowing in a DRAM. One such approach is to change the refresh period of the DRAM based on the temperature of the DRAM where the temperature is divided into several ranges. More particularly, a comparatively lower period of a refresh clock may be used at a lower temperature as, typically, at a lower temperature, the DRAM is able to retain data for a longer time.

One problem with the changing of the refresh period is that the characteristics of the temperature sensor used to determine the device temperature may change significantly due to variations during manufacture of the temperature sensor. As a result, erroneous temperature measurements may be provided for the DRAM. For example, a DRAM may be operating at 60° C., thus needing a relatively high-frequency refresh clock, but the temperature sensor may erroneously detect the temperature as 45° C. and select a low-frequency refresh clock. In this case, refresh errors may occur, possibly resulting in lost data. While the problem of temperature sensor variability may be reduced by the use of higher performance sensors, doing so typically will result in an increase in the size of the temperature sensor. Furthermore, other manufacturing process introduced variations in the DRAM may change the length of time the DRAM is able to retain data at various temperatures. In addition, to these sources of variability, a DRAM cell may become excessively deteriorated over time and some or all of the DRAM cell may fail to refresh successfully, potentially causing the computer system to experience a refresh malfunction for the entire DRAM cell.

SUMMARY OF THE INVENTION

Embodiments of the present invention include clock generation circuits for an integrated circuit device including a temperature sensor circuit, the temperature sensor circuit including a calibration circuit responsive to a temperature coding signal and a temperature sensor. The temperature sensor circuit has a first or test mode state in which a temperature output signal of the temperature sensor circuit is based on a temperature sensor output control signal and a second or normal mode state in which the temperature output signal is based on the temperature sensor and the calibration circuit. A clock period controller circuit includes a calibration circuit responsive to a period coding signal. The clock period controller circuit generates a period control signal based on the temperature output signal and the calibration circuit of the clock period controller circuit. A clock generator circuit generates a clock signal based on the period control signal.

In further embodiments of the present invention, the calibration circuit of the temperature sensor circuit includes a plurality of fuses and the temperature coding signal selects the state of the plurality of fuses to calibrate the temperature output signal relative to an output of the temperature sensor. The calibration circuit of the clock period controller circuit may also include a plurality of fuses and the period coding signal may select the state of the plurality of fuses to calibrate the period control signal.

In other embodiments of the present invention, the state of the temperature sensor circuit is selected based on the temperature sensor output control signal. The temperature output signal may be a digital signal having a plurality of states, ones of which correspond to temperature operating ranges of the integrated circuit device. The first state may be a test mode and the second state may be a normal operating mode. The temperature sensor output control signal may include a plurality of bits that designate ones of the temperature operating ranges in the test mode. The digital temperature output signal indicates a detected temperature of the integrated circuit device. The temperature sensor circuit may also include a multiplexer that outputs the temperature output signal based on the digital temperature signal from the temperature sensor and the temperature coding signal.

In further embodiments of the present invention, the clock period controller circuit includes a plurality of period controllers calibrated by the calibration circuit of the clock period controller circuit based on the period coding signal. One of the plurality of period controllers is selected by the temperature output signal to generate the period control signal. The clock generator circuit may include an oscillator that generates the clock signal with a period based on the period control signal. The integrated circuit device may be a memory device and the clock signal may be a refresh clock.

In other embodiments of the present invention, integrated circuit memory devices are provided including a temperature sensor circuit including a calibration circuit responsive to a temperature coding signal and a temperature sensor that generates an operating temperature signal responsive to a temperature of the memory device and the calibration circuit. The temperature sensor circuit has a first state in which a temperature output signal of the temperature sensor circuit is based on a temperature sensor output control signal and a second state in which the temperature output signal is the operating temperature signal. The first state or the second state is selected by the temperature sensor output control signal. A clock period controller circuit, including a calibration circuit responsive to a period coding signal, generates a period control signal based on the temperature output signal and the calibration circuit of the clock period controller circuit. A clock generator circuit generates a refresh clock of the memory device based on the period control signal. The operating temperature signal and the temperature sensor output control signal each may include a plurality of bits, ones of which correspond to temperature operating ranges of the memory device.

In further embodiments of the present invention, methods are provided for controlling the refresh period of an integrated circuit memory device. A temperature sensor circuit of the memory device is calibrated to generate an operating temperature signal corresponding to an operating temperature of the memory device by inputting to the temperature sensor circuit a selected temperature coding signal. A test mode of the temperature sensor circuit is selected in which a temperature output signal of the temperature sensor circuit is based on a temperature sensor output control signal or a normal mode of the temperature sensor circuit is selected in which the temperature output signal is the operating temperature signal. The first state or the second state is selected by the temperature sensor output control signal. A clock period controller circuit of the memory device is calibrated to generate a period control signal having a desired period by inputting to the clock period controller circuit a period coding signal, the period control signal further being based on the temperature output signal. A refresh clock of the memory device is generated, the period of the refresh clock being based on the period control signal.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE INVENTION

Figure 1:
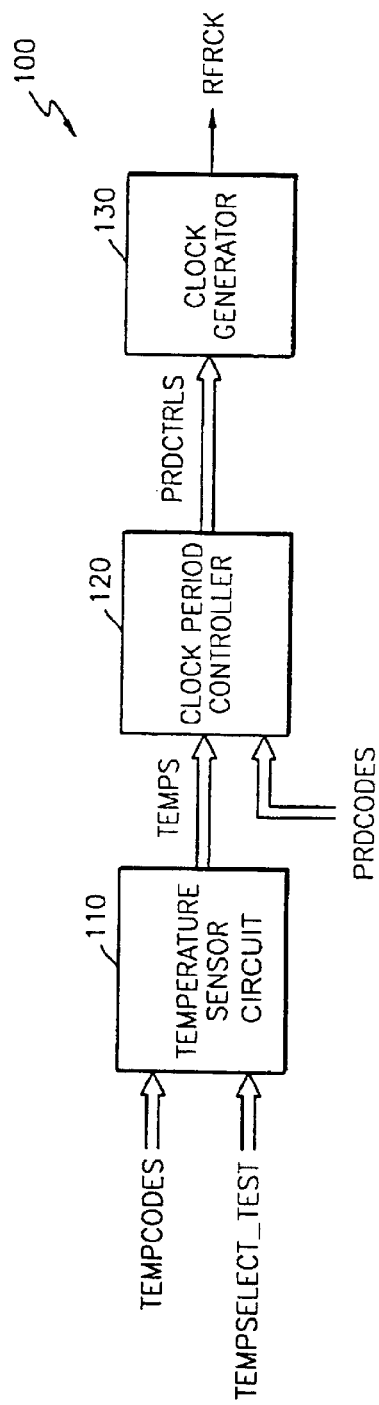
FIG. 1 is a block diagram of a clock generation circuit for an integrated circuit memory device in which a refresh clock period can be controlled in accordance with embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when elements are referred to as being coupled to one another, this coupling may be direct or via one or more intervening elements while "directly coupled" shall be understood as coupled without intervening elements. Moreover, each embodiment described and illustrated herein includes its complementary conductivity type embodiment as well.

Figure 2:
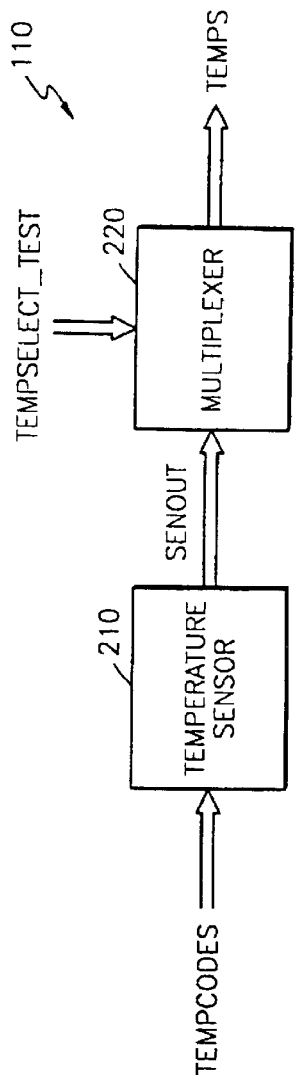
FIG. 2 is a block diagram illustrating a temperature sensor according to embodiments of the present invention that may be used in the circuit of FIG. 1.

The present invention will now be described with reference to the embodiments of the invention illustrated in FIG. 1. More particularly, FIG. 1 illustrates a clock generation circuit 100 of an integrated circuit memory device. As shown in FIG. 1, the clock generation circuit 100 of the integrated circuit (semiconductor) memory device includes a temperature sensor circuit 110, a clock period controller circuit 120, and a clock generator circuit 130. The temperature sensor circuit 110 includes a calibration circuit, such as a plurality of selectable fuses, where the states of the fuses are selected to calibrate the temperature sensor circuit 110. As shown in FIG. 2, the temperature sensor circuit 110 further includes a temperature sensor 210.

The temperature sensor circuit 110 includes a first state or test mode, which may be referred to as an MRS mode, in which the circuit 110 may be calibrated responsive to the temperature coding signal TEMPCODES. For example, TEMPCODES may be a digital signal including a plurality of bits designating ones of the plurality of fuses to be cut to calibrate the temperature output signal TEMPS relative to an output temperature of the temperature sensor 210 so that the temperature output signal TEMPS will correctly indicate the temperature operating range of the integrated circuit memory device including the clock generation circuit 100. In the test mode, the temperature output signal TEMPS is based on the temperature sensor output control signal TEMPSELECT_TEST as will be described further with reference to FIG. 2 below. The temperature sensor circuit 110 also has a second state or normal operating mode in which the temperature output signal TEMPS is based on the sensor output signal SENOUT from the temperature sensor 210 as calibrated by the calibration circuit of the temperature sensor circuit 110.

In the test or MRS mode, as noted above, the output TEMPS is determined responsive to the temperature sensor output control signal TEMPSELECT_TEST. Thus, the output TEMPS may be selectively set to indicate a particular temperature range of the integrated circuit memory device independent of the sensor output signal SENOUT of the temperature sensor 210. As will be described below with reference to FIG. 2, the TEMPSELECT_TEST signal may also be used to select the second or normal operating mode of the temperature sensor circuit 110 in which the temperature output signal TEMPS is responsive to the output SENOUT of the temperature sensor 210.

The clock period controller circuit 120 generates a period control signal PRDCTRLS based on the temperature output signal TEMPS. For example, the output of the clock period controller circuit 120 may be used to generate a refresh clock RFRCK, where the refresh period is appropriate for the corresponding operating temperature range of the integrated circuit memory device as indicated by the temperature output signal TEMPS. The clock period controller circuit 120 also includes a calibration circuit for calibrating the period control signal PRDCTRLS at one or more of the temperature operating ranges indicated by the temperature output signal TEMPS. The calibration circuit may, for example, include a plurality of fuses, the states of which may be selected by a period coding signal PRDCODES so that selected ones of the plurality of fuses may be cut to calibrate the period control signal PRDCTRLS. In such embodiments, the period coding signal PRDCODES may include a plurality of bits that designate the states of corresponding fuses of the calibration circuit of the clock period controller 120. The clock generator circuit 130 generates a clock signal, such as a refresh clock RFRCK, based on the period control signal PRDCTRLS.

Operations of the clock generation circuit 100 in accordance with embodiments of the present invention will now be further described with reference to FIG 1. It will be understood that the temperature sensor characteristics of the temperature sensor 210 may change due to variations in the manufacturing process used to produce the clock generation circuit 100. As a result, errors in indicated operating temperature range may be encountered. For example, the temperature of an integrated circuit (semiconductor) memory device including the clock generation circuit 100 may, as initially fabricated, be erroneously indicated as operating at a range about 80° C. when the real operating temperature is in a range about 100° C. This condition may be addressed in the test mode by selecting the value of the temperature coding signal TEMP CODES to cut ones of the plurality of fuses of the calibration circuit of the temperature sensor circuit 110 so that the temperature sensor 110 more accurately indicates the operational temperature. It is to be understood that the fuses may be part of the temperature sensor 210 so that the output SENSOUT is calibrated by the calibration circuit of the temperature sensor circuit 110 as illustrated in the embodiments of FIG 2 or that the calibration circuit be separate from the temperature sensor 210 and calibrate the output signal TEMPS relative to the output SENSOUT.

An example of the temperature coding signal in which the temperature coding signal TEMPCODES is a digital signal including a plurality of states, such as bits, will now be further described. For instance, the temperature coding signal TEMPCODES may include bits corresponding to fuses defining the calibration circuit. For this example, a specified operating temperature range, such as about 100° C. can be used as a calibration temperature. Values for the temperature coding signal TEMPCODES can be varied from 000000 to 111111 to produce the corresponding desired output TEMPS at the calibration temperature where the sensor coding signal TEMPCODES is composed of six bits. The fuses included in the calibration circuit of the temperature sensor circuit 110 are cut according to the input temperature coding signal TEMPCODES during the calibration mode, such as in the test mode. As a result, the real operating temperature range of the integrated circuit memory device as detected by the temperature sensor 210 will generate the correct temperature output signal TEMPS when the normal operating mode is selected by the temperature sensor output control signal TEMPSELECT_TEST.

For this illustrative example, the temperature sensor output control signal TEMPSELECT_TEST includes a plurality of bits, each bit selecting one of a plurality of possible temperature operating ranges of the integrated circuit memory device. For example, the operating temperature condition of the integrated circuit memory device may be divided into three ranges about 100° C., 70° C., and 40° C. respectively. A three bit TEMPSELECT_TEST signal may be used with each bit corresponding to one of the three ranges. Similarly, the temperature output signal TEMPS may have three bits each corresponding to one of the temperature operating ranges of the integrated circuit memory device.

Figure 3:
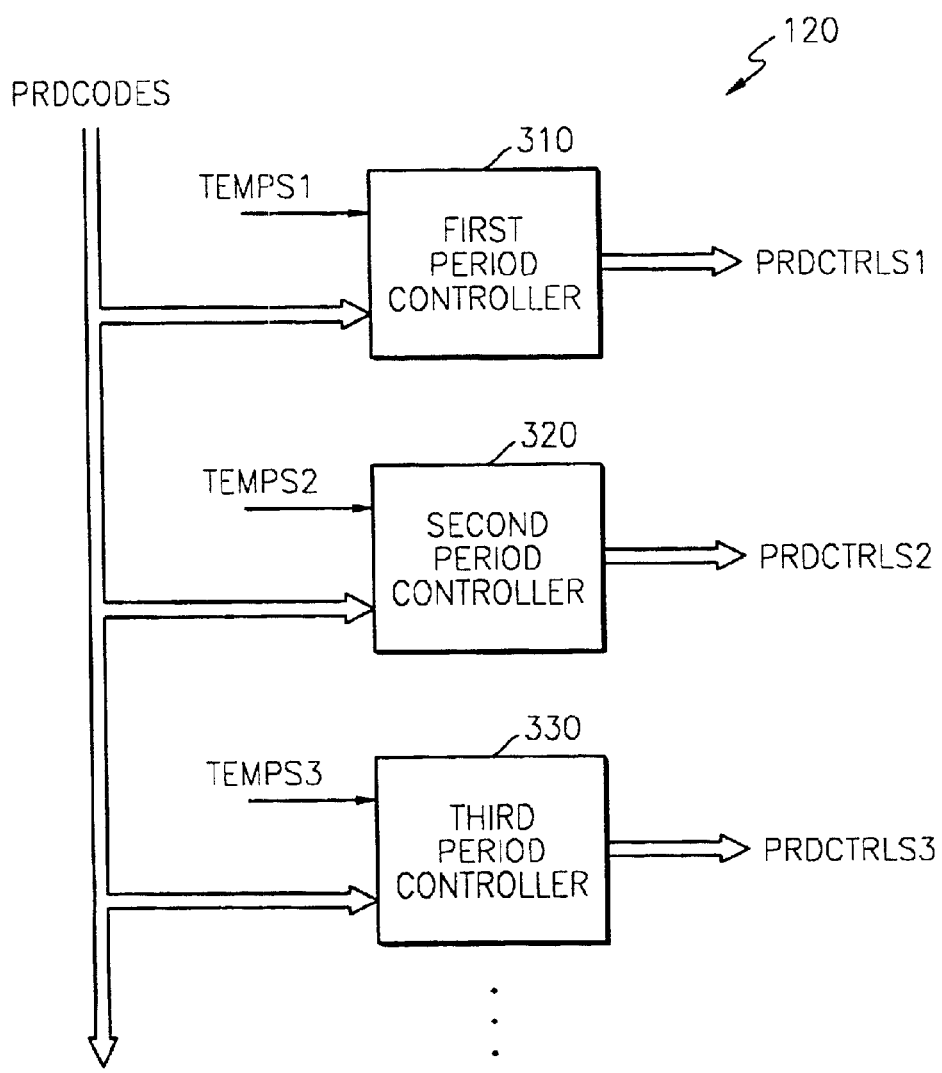
FIG. 3 is a block diagram illustrating a clock period controller according to embodiments of the present invention that may be used in the circuit of FIG. 1.

The clock period controller circuit 120 receives a selected period coding signal PRDCODES for calibration purposes and generates the period control signal PRDCTRLS to control the period of the refresh clock RFRCK. As shown in the embodiments of FIGS. 1 and 3, the period control signal PRDCTRLS is also responsive to the activated bit out of the plurality (three) of bits of the temperature output signal TEMPS.

As described with reference to the calibration circuit of the temperature sensor circuit 110, the period coding signal PRDCODES may include a plurality of bits that calibrate the clock period controller circuit 120 to output a desired period control signal PRDCTRLS. For example, a six bit period coding signal PRDCODES may be used to change the period control signal PRDCTRLS by changing the period coding signal PRDCODES to set the desired period of the refresh clock RFRCK. For example, the clock generation circuit 100 could be calibrated to provide for refreshing 6K bytes of memory at refresh periods ranging from about 10 ms to about 100 ms when the period coding signal PRDCODES varies from 000000 to 111111. As shown in FIG. 3, calibration may be provided for each of three temperatures ranges using a common PRDCODES input. For each temperature range associated with the TEMPS signal, associated fuses or other calibration circuit means in the clock period controller circuit 120 may be cut to provide the desired refresh period for the refresh clock RFRCK. Alternatively, the PRDCODES signal could be an input controlling the output PRDCTRLS based on a current state of the PRDCODES signal to provide the calibration of the clock period controller 120 rather than by coding of associated fuses.

The clock generator 130 receives the period control signal PRDCTRLS and generates a refresh clock RFRCK suitable for the indicated operating temperature range of the integrated circuit memory device. In various embodiments of the present invention, the clock generator 130 includes an oscillator that receives the period control signal PRDCTRLS and generates a refresh clock RFRCK having the desired period. The oscillator may continuously change the period of the refresh clock RFRCK. The clock generator 130 alternatively includes a counter. It may be possible to control the period of the refresh clock RFRCK using a counter more quickly than with an oscillator. The counter may continuously change the period of the refresh clock RFRCK by multiples, such as twice or four times a base period.

The apparatus of the present invention will now be further described with reference to the embodiments illustrated in FIG. 2. As shown in the embodiments of FIG. 2, the temperature sensor circuit 110 includes a multiplexer 220 as well as the temperature sensor 210. For purposes of this explanation, the sensor output signal SENOUT of the temperature sensor 210 will be considered as having a plurality of bits (three) corresponding to the temperature sensor output control signal TEMPSELECT_TEST and temperature output signal TEMPS in the example described above corresponding to three operating ranges of the integrated circuit memory device (such as about 100° C., 70° C., and 40° C. respectively). The bits need not correspond individually to ones of the temperatures ranges. By way of example, the sensor output signal SENOUT may be "111" for the operating temperature range about 100° C. Similarly, for the ranges about 70° C. and 40° C., the sensor output signal SENOUT may be "01" and "001."

The multiplexer 220 receives the sensor output signal SENOUT and the temperature output control signal TEMPSELECT_TEST and generates the temperature output signal TEMPS. In particular embodiments of the present invention, the temperature sensor output control signal TEMPSELECT_TEST controls the output selected by the multiplexer 220 using a plurality of bits, which will be further described with reference to a three bit embodiment. The temperature output signal TEMPS is determined only by the temperature sensor output control signal TEMPSELCT_TEST, which is not dependent on the sensor output signal SENOUT from the temperature sensor 210, when any one bit out of the temperature sensor output control signal TEMPSELECT_TEST has a logic "high" value and the other two bits have logic "low" values. The temperature output signal TEMPS is determined by the sensor output signal SENOUT when all bits of the temperature sensor output control signal TEMPSELECT_TEST have logic "low" values. Thus, the normal operating mode may be selected by setting TEMPSELECT_TEST to all low values so the output of the temperarture sensor 210 drives the TEMPS signal to indicate the actual temperature operating range of the integrated circuit memory device.

Referring now to FIG. 3, embodiments of the clock period controller circuit 120 will be further described. As shown in FIG. 3, the clock period controller circuit 120 includes a plurality of period controllers 310, 320 and 330 that receive the period coding signal PRDCODES and generate the period control signal PRDCTRLS to control the period of the refresh clock RFRCK. It will be understood that the clock period controller circuit 120 may include more or less than three period controllers. Only one of the period controllers 310, 320 and 330 shown in FIG. 3 is enabled by the temperature output signal TEMPS. For example, if the temperature output signal TEMPS indicates operating in the range about 100° C., an operational temperature signal TEMPS1 (for example, corresponding to one of the three bits of the TEMPS signal associated with this temperature range) input to the first period controller 310 has a logic "high" value and other operational temperature signals TEMPS2 and TEMPS3 (the other two bits of the TEMPS signal corresponding to the other two operating temperature ranges) have logic "low" values. As a result, only the first period controller 310 is enabled, and the other period controllers 320 and 330 are disabled. Therefore, the first period controller 310 generates a first period control signal PRDCTRLS1. The first period control signal PRDCTRLS1 is then provided as the period control signal PRDCTRLS.

As described with reference to various embodiments above, the clock generation circuit 100 may provide a refresh period that is controlled independent of variations in temperature detection and process introduced variations in an integrated circuit memory device. This may, thereby, reduce power consumption and the busy rate of the integrated circuit memory device, such as a DRAM.

It should be noted that many variations and modifications can be made to the preferred embodiments described above without substantially departing from the principles of the present invention. All such variations and modifications are intended to be included herein within the scope of the present invention, as set forth in the following claims.

We claim:

1. A clock generation circuit for an integrated circuit device comprising:
   a temperature sensor circuit including a calibration circuit responsive to a temperature coding signal and a temperature sensor, the temperature sensor circuit having a first state in which a temperature output signal of the temperature sensor circuit is based on a temperature sensor output control signal and a second state in which the temperature output signal is based on the temperature sensor and the calibration circuit;
   a clock period controller circuit, including a calibration circuit responsive to period coding signal, that generates a period control signal based on the temperature output signal and the calibration circuit of the clock period controller circuit; and
   a clock generator circuit that generates a clock signal based on the period control signal;
   wherein the calibration circuit of the temperature sensor circuit comprises a plurality of fuses and wherein the temperature coding signal selects a state of ones of the plurality of fuses to calibrate the temperature output signal relative to an output of the temperature sensor; and
   wherein the first state or the second state of the temperature sensor circuit is selected based on the temperature sensor output control signal.

2. The circuit of claim 1 wherein the calibration circuit of the clock period controller circuit comprises a plurality of fuses and wherein the period coding signal selects a state of ones of the plurality of fuses to calibrate the period control signal.

3. The circuit of claim 1 wherein the temperature output signal comprises a digital signal having a plurality of states, ones of which correspond to temperature operating ranges of the integrated circuit device.

4. The circuit of claim 3 wherein the first state comprises a test mode and the second state comprises a normal operating mode and wherein the temperature sensor output control signal comprises a plurality of bits that designate ones of the temperature operating ranges in the test mode.

5. The circuit of claim 1 wherein the temperature sensor outputs a digital temperature signal based on a detected temperature of the integrated circuit device and wherein the temperature sensor circuit further comprises a multiplexer that outputs the temperature output signal based on the digital temperature signal from the temperature sensor and the temperature coding signal.

6. The circuit of claim 5 wherein the digital temperature signal from the temperature sensor and the temperature sensor output control signal each comprise a plurality of bits, ones of which correspond to temperature operating ranges of the integrated circuit device.

7. The circuit of claim 1 wherein the clock period controller circuit comprises a plurality of period controllers calibrated by the calibration circuit of the clock period controller circuit based on the period coding signal, at least one of the plurality of period controllers being selected by the temperature output signal to generate the period control signal.

8. The circuit of claim 1 wherein the clock generator circuit comprises an oscillator that generates the clock signal with a period based on the period control signal.

9. The circuit of claim 1 wherein the integrated circuit device comprises a memory device and wherein the clock signal comprises a refresh clock.

10. An integrated circuit memory device comprising:
   a temperature sensor circuit including a calibration circuit responsive to a temperature coding signal and a temperature sensor that generates an operating temperature signal responsive to a temperature of the memory device and the calibration circuit, the temperature sensor circuit having a first state in which a temperature output signal of the temperature sensor circuit is based on a temperature sensor output control signal and a second state in which the temperature output signal is the operating temperature signal, the first state or the second state being selected by the temperature sensor output control signal;

a clock period controller circuit, including a calibration circuit responsive to a period coding signal, that generates a period control signal based on the temperature output signal and the calibration circuit of the clock period controller circuit; and a clock generator circuit that generates a refresh clock of the memory device based on the period control signal;

wherein the clock period controller circuit comprises a plurality of period controllers calibrated by the calibration circuit of the clock period controller circuit based on the period coding signal, one of the plurality of period controllers being selected by the temperature output signal to generate the period control signal.

11. The memory device of claim 10 wherein the operating temperature signal and the temperature sensor output control signal each comprise a plurality of bits, ones of which correspond to temperature operating ranges of the memory device.

12. The memory device of claim 10 wherein the clock generator circuit comprises an oscillator that generates the refresh clock with a period based on the period control signal.

13. A method for controlling the refresh period of an integrated circuit memory device comprising:

calibrating a temperature sensor circuit of the memory device to generate an operating temperature signal corresponding to an operating temperature of the memory device by inputting to the temperature sensor circuit a selected temperature coding signal;

selecting a test mode of the temperature sensor circuit in which a temperature output signal of the temperature sensor circuit is based on a temperature sensor output control signal or to select a normal operating mode of the temperature sensor circuit in which the temperature output signal is the operating temperature signal, the test mode or the normal operating mode being selected by the temperature sensor output control signal;

calibrating a clock period controller circuit of the memory device to generate a period control signal having a desired period by inputting to the clock period controller circuit a period coding signal, the period control signal further being based on the temperature output signal; and generating a refresh clock of the memory device, the period of the refresh clock being based on the period control signal.

14. A semiconductor memory device comprising:

a temperature sensor including a plurality of fuses, the temperature sensor for receiving a sensor coding signal, thereby cutting the plurality of fuses, and generating an operational temperature signal, which indicates the real temperature at which the semiconductor memory device operates, in response to a temperature sensor output control signal;

a clock period controller having a plurality of fuses, the clock period controller for receiving a period coding signal, thereby cutting the plurality of fuses, and generating a period control signal in response to the operational temperature signal;

a clock generator for receiving the period control signal and generating a refresh clock, the period of which is controlled in accordance to the operational temperature of the semiconductor memory device; and wherein the temperature sensor output control signal comprises a plurality of bits, indicates whether the semiconductor memory device is in a test mode or a normal operating mode, and indicates the temperature range at which the semiconductor memory device operates.

15. The semiconductor memory device as claimed in claim 14, wherein the clock generator comprises an oscillator that generates the refresh clock, the period of which is controlled by the period control signal.

16. The semiconductor memory device as claimed in claim 14, wherein the clock generator further comprises a counter that changes the period of the refresh clock by receiving an output signal of the oscillator.

17. A semiconductor memory device comprising:

a temperature sensor including a plurality of fuses, the temperature sensor for receiving a sensor coding signal, thereby cutting the plurality of fuses, and generating an operational temperature signal, which indicates the real temperature at which the semiconductor memory device operates, in response to a temperature sensor output control signal;

a clock period controller having a plurality of fuses, the clock period controller for receiving a period coding signal, thereby cutting the plurality of fuses, and generating a period control signal in response to the operational temperature signal;

a clock generator for receiving the period control signal and generating a refresh clock, the period of which is controlled in accordance to the operational temperature of the semiconductor memory device; and wherein the temperature sensor comprises:

a temperature sensor for outputting a sensor output signal including a plurality of bits by receiving the sensor coding signal and sensing the real operational temperature of the semiconductor memory device; and a multiplexer for receiving the sensor output signal and generating the operational temperature signal according to logic values of the plurality of bits of the sensor output signal in response to the temperature sensor output signal.

18. The semiconductor memory device as claimed in claim 17, wherein the sensor coding signal comprises a plurality of bits and changes the sensing temperature of the temperature sensor.

19. The semiconductor memory device as claimed in claim 17, wherein the number of bits of the sensor output signal is the same as the number of bits of the temperature sensor output control signal.

20. A semiconductor memory device comprising:

a temperature sensor including a plurality of fuses, the temperature sensor for receiving a sensor coding signal, thereby cutting the plurality of fuses, and generating an operational temperature signal, which indicates the real temperature at which the semiconductor memory device operates, in response to a temperature sensor output control signal;

a clock period controller having a plurality of fuses, the clock period controller for receiving a period coding signal, thereby cutting the plurality of fuses, and generating a period control signal in response to the operational temperature signal;

a clock generator for receiving the period control signal and generating a refresh clock, the period of which is controlled in accordance to the operational temperature of the semiconductor memory device; and wherein the clock period controller is enabled by the operational temperature signal and comprises a plurality of period controllers that generate the period control signal by receiving the period coding signal.

21. The semiconductor memory device as claimed in claim 20 wherein the period coding signal comprises a plurality of bits and changes the period control signal generated from the clock period controller.

22. A method of controlling the period of a refresh clock in accordance to variations in the operational temperature of the semiconductor memory device that includes a temperature sensor having a plurality of fuses and a clock period controller, the method comprising the steps of:

(a) receiving a sensor coding signal, thereby cutting a plurality of fuses of the temperature sensor, and generating an operational temperature signal indicating the real temperature at which the semiconductor memory device operates;

(b) receiving a period coding signal, thereby cutting a plurality of fuses of the clock period controller, and generating a period control signal in response to the operational temperature signal; and (c) receiving the period control signal and generating the refresh clock, the period of which is controlled in accordance to the operational temperature of the semiconductor memory device; and wherein the temperature sensor output control signal comprises a plurality of bits and indicates the temperature range at which the semiconductor memory device operates and whether the semiconductor memory device is in a test mode or a normal operating mode.

23. The method as claimed in claim 22, wherein step (b) comprises the steps of:

(b1) enabling one bit of the operational temperature signal; and (b2) generating a period control signal by receiving the period coding signal, which controls the period of the refresh clock, in response to the enabled operational temperature signal.

24. The method as claimed in claim 23, wherein the period coding signal comprises a plurality of bits and changes the period control signal generated from the clock period controller.

25. A method of controlling the period of a refresh clock in accordance to variations in the operational temperature of the semiconductor memory device that includes a temperature sensor having a plurality of flames and a clock period controller, the method comprising the steps of:

(a) receiving a sensor coding signal, thereby cutting a plurality of fuses of the temperature sensor, and generating an operational temperature signal indicating the real temperature at which the semiconductor memory device operates;

(b) receiving a period coding signal, thereby cutting a plurality of fuses of the clock period controller, and generating a period control signal in response to the operational temperature signal; and wherein step (a) comprises the steps of:

(a1) outputting a sensor output signal including a plurality of bits by receiving the sensor coding signal and sensing the real operational temperature; and (a2) generating the operational temperature signal according to logic values of a plurality of bits of the sensor output signal by receiving the sensor output signal and sensing the temperature sensor output control signal.

26. The method as claimed in claim 25, wherein the sensor coding signal comprises a plurality of bits and changes the temperature sensing temperature.

27. The method as claimed in claim 25, wherein the number of bits of the sensor output signal is the same as the number of bits of the temperature sensor output control signal.

* * * * *